US009083394B2

(12) United States Patent
Uejima et al.

(10) Patent No.: US 9,083,394 B2
(45) Date of Patent: Jul. 14, 2015

(54) HIGH-FREQUENCY SWITCH MODULE

(75) Inventors: Takanori Uejima, Moriyama (JP);
Shinya Watanabe, Okayama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 1077 days.

(21) Appl. No.: 13/036,029

(22) Filed: Feb. 28, 2011

(65) Prior Publication Data

US 2011/0181342 A1 Jul. 28, 2011

Related U.S. Application Data

(63) Continuation of application No. PCT/JP2009/065044, filed on Aug. 28, 2009.

(30) Foreign Application Priority Data

Sep. 1, 2008 (JP) ................... 2008-223687

(51) Int. Cl.
*H03K 17/00* (2006.01)
*H04B 1/00* (2006.01)
*H04B 1/48* (2006.01)

(52) U.S. Cl.
CPC .............. *H04B 1/006* (2013.01); *H04B 1/0057* (2013.01); *H04B 1/48* (2013.01)

(58) Field of Classification Search
CPC ................... H01L 2924/00; H01L 2924/0002; H04N 5/2258; H04N 5/23212
See application file for complete search history.

(56) References Cited

U.S. PATENT DOCUMENTS 5,789,966 A * 8/1998 Bechade .................. 327/407
2009/0153417 A1 * 6/2009 Chen ......................... 343/702

FOREIGN PATENT DOCUMENTS

| JP | 2004-304581 A | 10/2004 |
| JP | 2005-197855 A | 7/2005 |
| JP | 2007-036452 A | 2/2007 |
| JP | 2009-033598 A | 2/2009 |

OTHER PUBLICATIONS

Official Communication issued in International Patent Application No. PCT/JP2009/065044, mailed on Oct. 20, 2009.
Official Communication issued in corresponding Japanese Patent Application No. 2010-504344, mailed on Nov. 30, 2010.

* cited by examiner

*Primary Examiner* — Sibin Chen
(74) *Attorney, Agent, or Firm* — Keating & Bennett, LLP

(57) ABSTRACT

A high-frequency switch module includes a switch element, high-frequency circuits, and a GND circuit. The switch element includes an antenna port, switch ports, and an FET switch. The FET switch switches connection between the switch ports and the antenna port. The high-frequency circuits connect any of the switch ports to a signal processing circuit. In the GND circuit, the switch port, which is not connected to the high-frequency circuits, is directly connected to a GND electrode.

5 Claims, 10 Drawing Sheets (7)

|  | SWITCH PORT | SWITCH PORT | SWITCH PORT |
|---|---|---|---|
| Ps6 OPENED | 28.5dB | 23.4dB | 22.4dB |
| GND CIRCUIT 7 | 36.8dB | 32.0dB | 32.2dB |
| GND CIRCUIT 17 | 32.1dB | 27.3dB | 26.8dB |

HIGH-FREQUENCY SWITCH MODULE

BACKGROUND OF THE INVENTION

1. Field of the Invention

The present invention relates to high-frequency switch modules that switch between transmission and reception of communication signals having certain frequencies and, more particularly, to a high-frequency switch module including a field effect transistor (FET) switch.

2. Description of the Related Art

Various wireless communication methods are currently adopted in communication apparatuses including mobile phones. For example, multiband Global System for Mobile Communication (GSM) methods have been adopted in Europe. Multiple communication signals (transmission and reception signals) using different frequency bands exist in the GSM methods and the frequency bands including an 850 MHz band, a 900 MHz band, a 1,800 MHz band, and a 1,900 MHz band exist in the GSM methods. In addition, Universal Mobile Telecommunication System (UMTS) methods using a 2,100 MHz band exist as next-generation wireless communication methods. There are cases in which high-frequency switch modules are used in front-ends units of communication apparatuses that transmit and receive the communication signals within the multiple frequency bands with one antenna (for example, refer to Japanese Unexamined Patent Application Publication No. 2005-197855). The high-frequency switch modules switch signal transmission paths from antennas to transmission or reception circuits of the communication signals within desired frequency bands by using FET switches.

Japanese Unexamined Patent Application Publication No. 2005-197855 discloses a high-frequency switch module provided with a Single Pole n Throw (SPnT) switch element using a GaAs FET switch. The SPnT switch element includes one antenna port and n-number switch ports. A transmission or reception circuit provided for each frequency band is connected to each switch port. The transmission and reception circuits of a total number n or more are provided.

Since the wireless communication methods of different numbers or types are used in different nations, the number and types of circuits to be connected to switch elements are varied depending on the specifications of the communication apparatuses. Accordingly, in the related art, it is necessary to separately design the configuration of the switch element and the configuration of the mounting board of the switch element in accordance with the number and/or types of the wireless communication methods, thus increasing the design time and the manufacturing cost due to the separate design. Consequently, it is desirable to reduce the design time and the manufacturing cost.

In addition, in general, it is necessary to increase isolation of the communication signals between the transmission or reception circuit connected to the switch element and the antenna in the front-end unit in each communication apparatus. However, since the signals are apt to wrap around through an FET switch in the high-frequency switch module using the FET switch, it is necessary to take measures against the wrapping around of the signals.

SUMMARY OF THE INVENTION

Accordingly, preferred embodiments of the present invention provide a high-frequency switch module that is capable of easily adapting the number and/or types of wireless communication methods to different specifications and that has excellent isolation characteristics.

A high-frequency switch module according to a preferred embodiment of the present invention includes a switch element, a high-frequency circuit, and a GND circuit. The switch element includes an antenna port, a plurality of switch ports, and a FET switch. The antenna port is connected to an antenna through which a communication signal is transmitted and received. Each switch port is alternatively selected for connection to the antenna port. The FET switch switches the connection between the switch ports and the antenna port. The high-frequency circuit connects any of the plurality of switch ports to a communication-signal processing circuit processing the communication signal. The GND circuit includes at least one free switch port among the plurality of switch ports, to which the high-frequency circuit is not connected, and the free switch port is connected to a GND electrode directly or via an impedance unit including a circuit element in the GND circuit.

In the above configuration, some of the switch ports included in the switch element are preferably used as the switch ports to which the high-frequency circuit is connected (hereinafter referred to as connected switch ports) and the remaining switch ports are preferably used as the switch ports that are not connected to the high-frequency circuit (hereinafter referred to as free switch ports). Accordingly, there is no need to change the configuration of the switch element when the number or kind of the high-frequency circuit is varied, so that the high-frequency switch module can be configured by using the standardized switch element.

If the free switch port is used with nothing connected in the above-described case, an input signal is entirely reflected at the free switch port because the antenna port has a substantially infinite characteristic impedance when the antenna port is connected to the free switch port. Accordingly, the reflected signal leaks out to the other switch ports through the FET switch to degrade the isolation between the antenna port and the connected switch ports.

For this reason, the GND circuit is preferably connected to the free switch port in this configuration. With this configuration, since a portion between the FET switch and the antenna port is substantially grounded when the antenna port is connected to the free switch port, a signal from the antenna port is entirely reflected between the antenna port and the FET switch and is not incident on the FET switch. As a result, no unnecessary signal is propagated to the other connected switch ports. Consequently, the amount of input signal leaking from the antenna port into the connected switch ports is reduced, thus improving the isolation between the antenna port and the connected switch ports.

In the FET switch, the free switch port may be temporarily connected to the antenna port in the switching of the switch port to be connected to the antenna port.

The impedance unit preferably includes a resistor having a characteristic impedance of about 50Ω, for example. In this case, an input signal is consumed at the resistor in the impedance unit, thus improving the isolation.

The FET switch may be a GaAs semiconductor FET switch, for example. In this case, the impedance unit is preferably a capacitor connected in series between the free switch port and the GND electrode, for example. In general, the GaAs semiconductor FET switch may not appropriately perform the switching operation when the free switch port is directly connected to the GND electrode. Accordingly, in this configuration, the impedance unit preferably includes the capacitor and the impedance is made close to zero for a signal having a certain frequency to entirely reflect the signal at the antenna port, so that the switching operation of the GaAs semiconductor FET switch can be appropriately performed.

It is preferred that the switch element, the high-frequency circuit, and the GND circuit be integrally formed on a ceramic multilayer substrate in which dielectric layers and wiring electrodes are alternately layered. In this case, the high-frequency switch module can be configured with one chip, for example, to reduce the size of the high-frequency switch module. In addition, it is possible to reduce the loss due to the wiring between the components, compared with discrete configuration.

It is preferred that the ceramic multilayer substrate include the GND electrode provided on a layered surface different from an installation surface of the switch element and that the connected switch port be connected to the GND electrode through a via hole electrode in the GND circuit. With this configuration, no unnecessary parasitic component occurs in a portion that extends from the free switch port to the GND circuit. In addition, since it is difficult for the via hole electrode to be magnetically coupled to the other wiring electrodes, the isolation between the elements is improved.

It is preferred that the ceramic multilayer substrate include a plurality of GND electrodes and that the connected free switch port be directly connected to the GND electrode that is arranged closest to the installation surface of the switch element in the layering direction of the dielectric layers via the via hole electrode provided in the ceramic multilayer substrate in the GND circuit.

The plurality of switch ports are preferably arranged along a peripheral edge of one main surface of the switch element, and the free switch port is preferably arranged so as to be sandwiched between the plurality of switch ports.

A high-frequency switch module according to a preferred embodiment of the present invention includes a switch element and a high-frequency circuit. At least two switch ports among the plurality of switch ports are connected to one of the high-frequency circuits.

In a preferred embodiment of the present invention, some of the switch ports included in the switch element are used as the connected switch ports and the remaining switch ports are used as the free switch ports. Accordingly, the high-frequency switch module can be configured by using the standardized switch element when the number or kind of the high-frequency circuit is varied.

In addition, since the free switch port is used in a non-opened state, the amount of input signal leaking from the antenna port into the connected switch ports is reduced, thus improving the isolation between the antenna port and the connected switch ports.

Consequently, it is possible to configure the high-frequency switch module having excellent isolation characteristics by using the standardized switch element.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 7 illustrates a result of simulation.

DETAILED DESCRIPTION OF THE PREFERRED EMBODIMENTS

A high-frequency switch module according to a first preferred embodiment of the present invention will now be described with reference to FIG. 1. The high-frequency switch module of the present preferred embodiment preferably defines a front-end unit of a mobile phone, for example.

Figure 1:
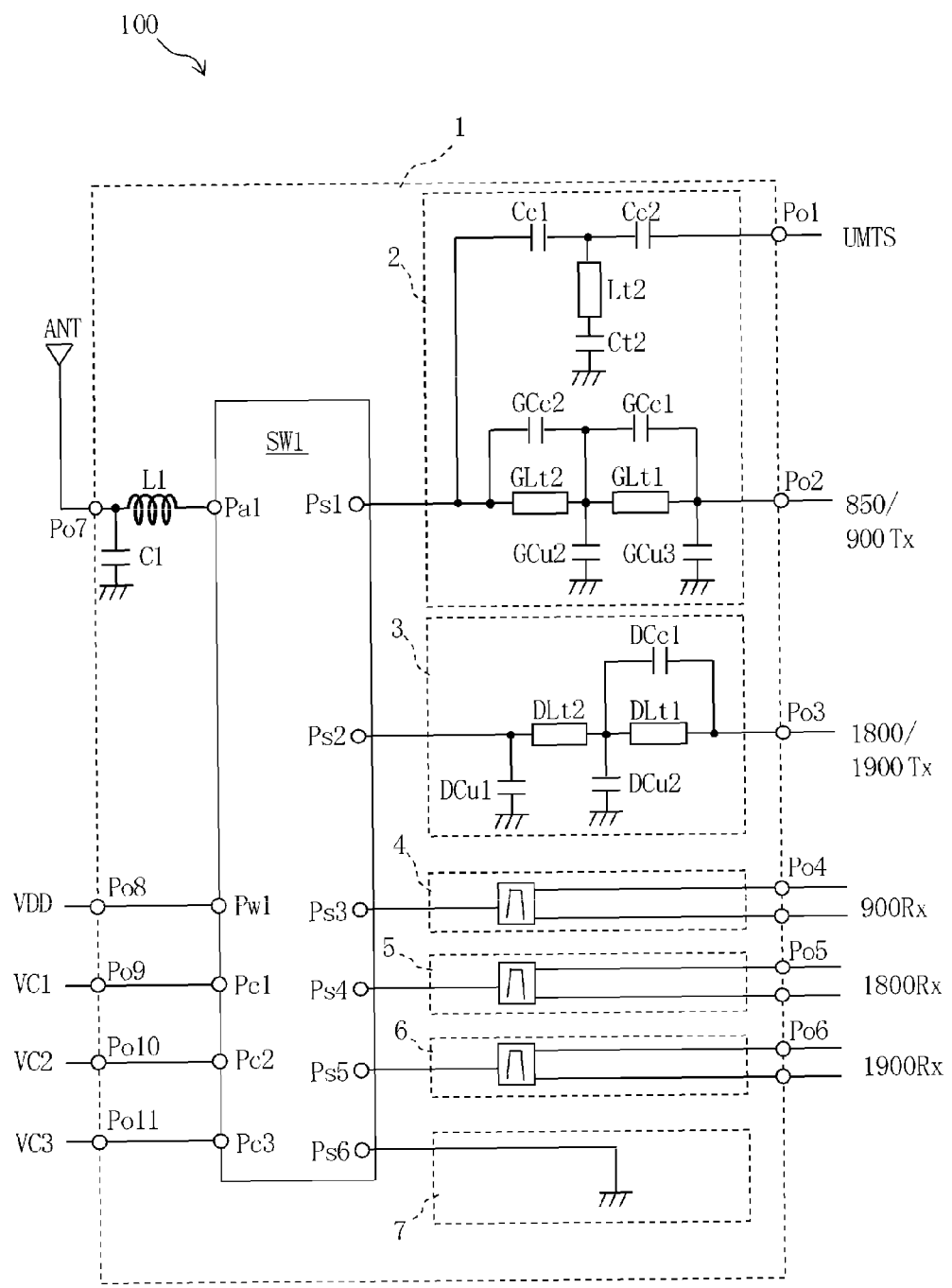
FIG. 1 is a block diagram schematically showing a front-end unit including a high-frequency switch module according to a first preferred embodiment of the present invention.

FIG. 1 is a block diagram schematically showing the front-end unit including the high-frequency switch module of the present preferred embodiment.

A front-end unit 100 includes a high-frequency switch module 1. The high-frequency switch module 1 preferably is a module in which the components are integrally provided on a ceramic multilayer substrate and includes outer connection terminals Po1 to Po11.

An antenna ANT is connected to the outer connection terminal Po7. A driving voltage VDD is applied to the outer connection terminal Po8. Controls signals Vc1 to Vc3, which are binary signals, are applied to the outer connection terminals Po9 to Po11, respectively. A UMTS 2100-MHz communication signal is input or output through the outer connection terminal Po1. A GSM 850-MHz transmission signal or a GSM 900-MHz transmission signal is input through the outer connection terminal Po2. A GSM 1800-MHz transmission signal or a GSM 1900-MHz transmission signal is input through the outer connection terminal Po3. A GSM 900-MHz reception signal is output through the outer connection terminal Po4. A GSM 1800-MHz reception signal is output through the outer connection terminal Po5. A GSM 1900-MHz reception signal is output through the outer connection terminal Po6.

The high-frequency switch module 1 includes a switch element SW1, high-frequency circuits 2 to 6, and a GND circuit 7. The switch element SW1 preferably is of a Single Pole 6 Throw (SP6T) type and includes a semiconductor FET switch (not shown), an antenna port Pa1, a drive port Pw1, control ports Pc1 to Pc3, and switch ports Ps1 to Ps6.

The semiconductor FET switch connects any of the switch ports Ps1 to Ps6 to the antenna port Pa1 in accordance with the combinations of the binary signals in the respective controls signals Vc1 to Vc3.

The antenna port Pa1 is connected to the outer connection terminal Po7 via a reactance element L1. The connection point between the outer connection terminal Po7 and the reactance element L1 is grounded via a capacitor C1. The drive port Pw1 is connected to the outer connection terminal Po8. The control ports Pc1 to Pc3 are connected to the outer connection terminals Po9 to Po11, respectively. The switch port Ps1 is connected to the outer connection terminal Po1 and the outer connection terminal Po2 via the high-frequency circuit 2. The switch port Ps2 is connected to the outer connection terminal Po3 via the high-frequency circuit 3. The switch port Ps3 is connected to the outer connection terminal Po4 via the high-frequency circuit 4. The switch port Ps4 is connected to the outer connection terminal Po5 via the high-frequency circuit 5. The switch port Ps5 is connected to the outer connection terminal Po6 via the high-frequency circuit 6. The switch port Ps6 is connected to the GND circuit 7.

The high-frequency circuit 2 includes a high pass filter provided between the switch port Ps1 and the outer connection terminal Po1 and a two-stage low pass filter provided between the switch port Ps1 and the outer connection terminal Po2. The high pass filter includes capacitors Cc1, Cc2, and Ct2 and a line Lt2. The UMTS 2100-MHz communication signal passes through the high pass filter. The two-stage low pass filter includes capacitors GCc1, GCc2, GCu2, and GCu3 and lines GLt1 and GLt2. The GSM 850-MHz transmission signal or the GSM 900-MHz transmission signal passes through the two-stage low pass filter to attenuate a higher harmonic wave, such as a second harmonic wave or a third harmonic wave, of the transmission signal.

The high-frequency circuit 3 includes a two-stage low pass filter provided between the switch port Ps2 and the outer connection terminal Po3. The two-stage low pass filter includes capacitors DCc1, DCu1, and DCu2 and lines DLt1 and DLt2. The GSM 1800-MHz transmission signal or the GSM 1900-MHz transmission signal passes through the two-stage low pass filter to attenuate a higher harmonic wave, such as a second harmonic wave or a third harmonic wave, of the transmission signal.

The high-frequency circuit 4 includes a surface acoustic wave (SAW) filter provided between the switch port Ps3 and the outer connection terminal Po4. The GSM 900-MHz reception signal passes through the SAW filter.

The high-frequency circuit 5 includes a SAW filter provided between the switch port Ps4 and the outer connection terminal Po5. The GSM 1800-MHz reception signal passes through the SAW filter.

The high-frequency circuit 6 includes a SAW filter provided between the switch port Ps5 and the outer connection terminal Po6. The GSM 1900-MHz reception signal passes through the SAW filter.

The switch port Ps6 is directly connected to a GND electrode in the GND circuit 7.

In order to increase the number of the high-frequency circuits because of, for example, a change in the design of the high-frequency switch module in the high-frequency switch module 1 having the above configuration, a new high-frequency circuit can be connected to the switch port Ps6 to easily divert the switch element SW1.

In addition, even if the switch port Ps6 temporarily conducts to the antenna port Pa1 in switching of the connection of the switch ports with the semiconductor FET switch, the antenna port Pa1 is substantially grounded because the free switch port Ps6 is connected to the GND circuit 7. Accordingly, a signal input through the antenna port Pa1 is entirely reflected between the antenna port Pa1 and the semiconductor FET switch and is not incident on the free switch port Ps6. Consequently, it is possible to ensure isolation between the antenna port and the switch ports even if the free switch port is provided as in the present preferred embodiment.

Figure 2:
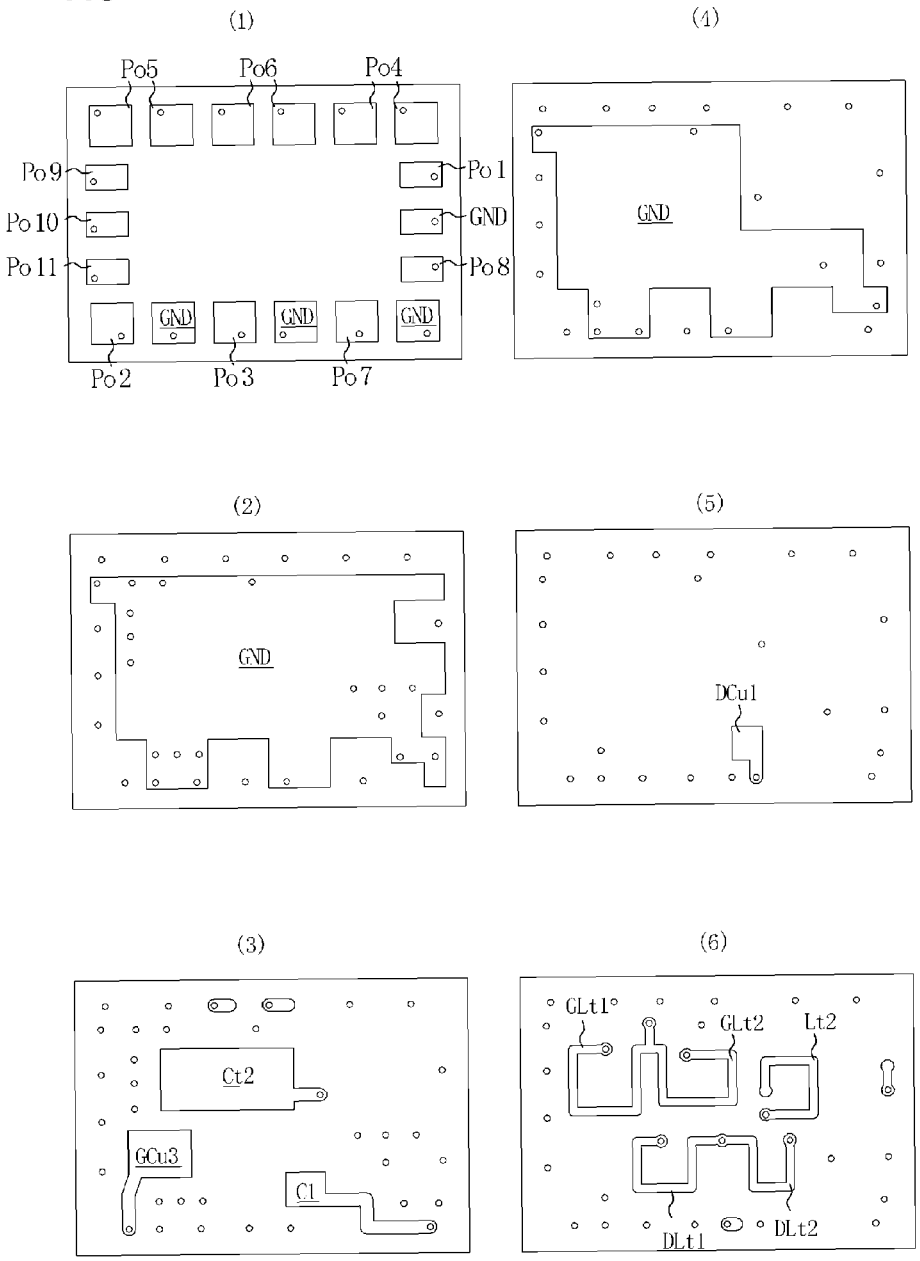
FIG. 2 is a layer diagram of the same switch module.
Figure 3:
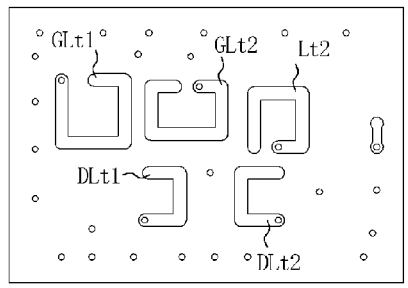
FIG. 3 is a layer diagram of the same switch module.
Figure 3:
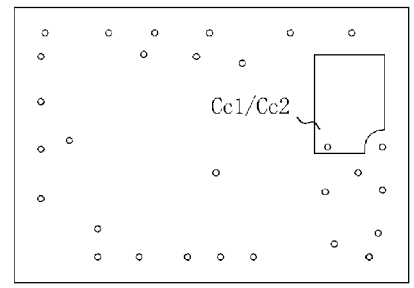
Figure 3:
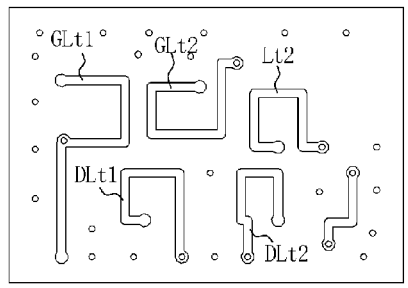
Figure 3:
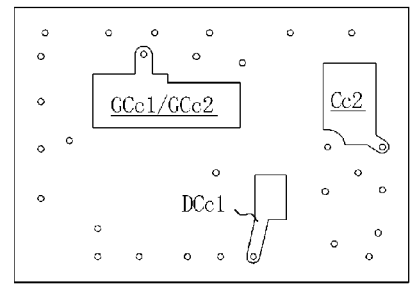
Figure 3:
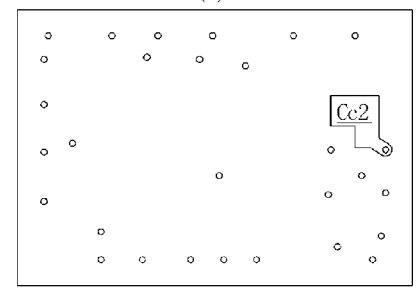
Figure 3:
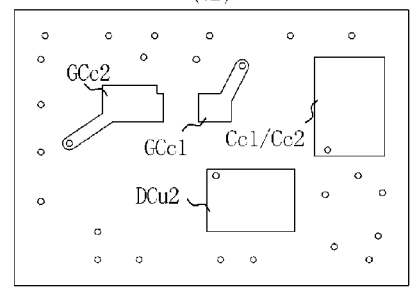
Figure 4:
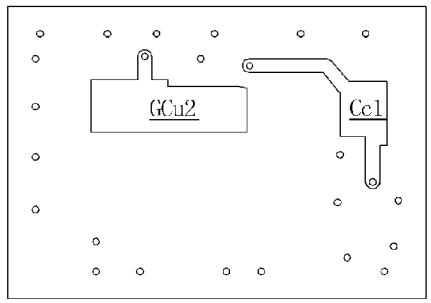
FIG. 4 is a layer diagram of the same switch module.
Figure 4:
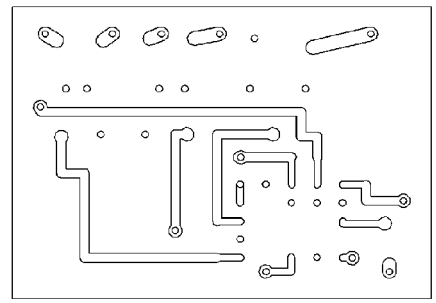
Figure 4:
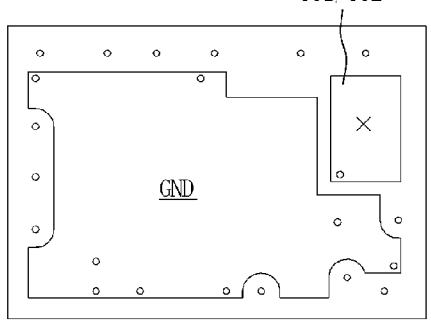
Figure 4:
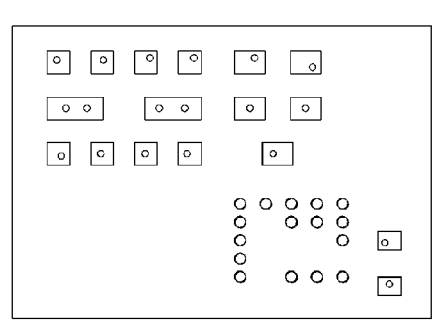
Figure 4:
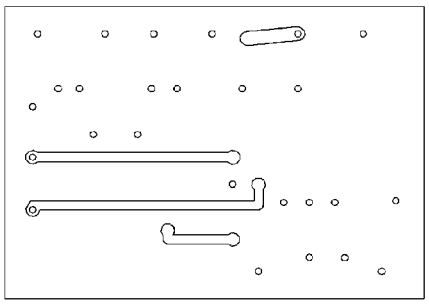
Figure 5:
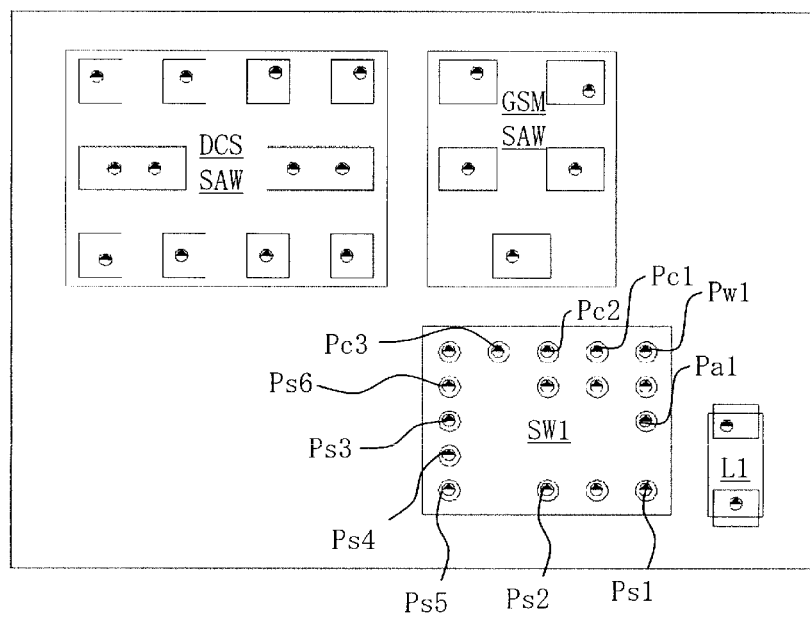
FIG. 5 is a diagram showing an element mounted surface of the same switch module.

FIGS. 2 to 4 are layer diagrams of the high-frequency switch module 1 and show dielectric layers (1) to (17) of the high-frequency switch module 1, viewed from the installation surface. FIG. 5 shows the high-frequency switch module 1, viewed from the surface on which the elements are mounted (element mounted surface) provided on the side opposite to the installation surface. Reference numerals and letters shown in FIGS. 2 to 5 correspond to the reference numeral and letters shown in FIG. 1. All circles in FIGS. 2 to 5 represent via holes.

On the dielectric layer (1), ground terminals GND and the outer connection terminals Po1 to Po11 are formed on the installation surface of the high-frequency switch module 1. The high-frequency switch module 1 is installed on an external circuit board with the installation surface. The switch element SW1, the reactance element L1, a filter element GSM SAW, and a filter element Digital Cellular System (DCS) SAW are mounted on the element mounted surface of the dielectric layer (17). The filter element GSM SAW is preferably used as the SAW filter of the high-frequency circuit 4 and the filter element DCS SAW preferably is a dual-type filter element in which the SAW filter of the high-frequency circuit 5 is integrated with the SAW filter of the high-frequency circuit 6.

An internal GND electrode conducting to the ground terminals GND of the dielectric layer (1) is provided on the dielectric layer (2). The electrodes of the capacitors Ct2 and GCu3 of the high-frequency circuit 2 and the electrode of the capacitor C1 connected to the antenna ANT via the outer connection terminal Po7 are provided on the dielectric layer (3). An internal GND electrode conducting to the ground terminals GND of the dielectric layer (1) is provided on the dielectric layer (4). The electrode of the capacitor DCu1 of the high-frequency circuit 3 is provided on the dielectric layer (5). The lines GLt1, GLt2, and Lt2 of the high-frequency circuit 2 and the lines DLt1 and DLt2 of the high-frequency circuit 3 are provided on the dielectric layer (6). The lines GLt1, GLt2, and Lt2 of the high-frequency circuit 2 and the lines DLt1 and DLt2 of the high-frequency circuit 3 provided on the dielectric layer (6) are continuously arranged on the dielectric layer (7). The lines GLt1, GLt2, and Lt2 of the high-frequency circuit 2 and the lines DLt1 and DLt2 of the high-frequency circuit 3 provided on the dielectric layer (7) are continuously arranged on the dielectric layer (8). The electrode of the capacitor Cc2 of the high-frequency circuit 2 is provided on the dielectric layer (9). The electrode common to the capacitor Cc1 and the capacitor Cc2 of the high-frequency circuit 2 is provided on the dielectric layer (10). The electrode of the capacitor Cc2 of the high-frequency circuit 2, the electrode common to the capacitor GCc1 and the capacitor GCc2 of the high-frequency circuit 2, and the electrode of the capacitor DCc1 of the high-frequency circuit 3 are provided on the dielectric layer (11). The electrode of the capacitor GCc1 of the high-frequency circuit 2, the electrode of the capacitor GCc2 of the high-frequency circuit 2, the electrode common to the capacitor Cc1 and the capacitor Cc2 of the high-frequency circuit 2, and the electrode of the capacitor DCc2 of the high-frequency circuit 3 are provided on the dielectric layer (12). The electrode of the capacitor GCc2 of the high-frequency circuit 2 and the electrode of the capacitor Cc1 of the high-frequency circuit 2 are provided on the dielectric layer (13). The electrode common to the capacitor Cc1 and the capacitor Cc2 of the high-frequency circuit 2 and an internal GND electrode conducting to the ground terminals GND of the dielectric layer (1) are provided on the dielectric layer (14). Via holes and connection lines are provided on the dielectric layers (15) and (16). The conduction between the electrode patterns on the dielectric layers is achieved by the via holes to provide the circuit shown in FIG. 1.

The antenna port Pa1 of the switch element SW1 is connected to one end of the reactance element L1 via the dielectric layers (17) and (16). The drive port Pw1 is connected to the outer connection terminal Po8 on the installation surface via the dielectric layers (17) to (1). The control port Pc1 is connected to the outer connection terminal Po9 on the installation surface via the dielectric layers (17) to (1). The control port Pc2 is connected to the outer connection terminal Po10 on the installation surface via the dielectric layers (17) to (1). The control port Pc3 is connected to the outer connection terminal Po11 on the installation surface via the dielectric layers (17) to (1). The switch port Ps1 is connected to the outer connection terminal Po1 and the outer connection terminal Po2 on the installation surface via the dielectric layers (17) to (1). The switch port Ps2 is connected to the outer connection terminal Po3 on the installation surface via the dielectric layers (17) to (1). The switch port Ps3 is connected to the filter element GSM SAW on the element mounted surface via the dielectric layers (17) and (16). The switch port Ps4 is connected to the filter element DCS SAW on the element mounted surface via the dielectric layers (17), (16), and (15). The switch port Ps5 is connected to the filter element DCS SAW on the element mounted surface via the dielectric layers (17) and (16). The switch port Ps6 is directly connected to the internal GND electrode provided on the dielectric layer (14) through the vias provided in the dielectric layers (17) to (14). Substantially directly connecting the free switch port Ps6 to the internal GND electrode via the via holes provided immediately below the free switch port Ps6 causes no unnecessary parasitic component and does not cause the via holes to be magnetically coupled to the other wiring electrodes, so that the isolation is further improved.

The high-frequency switch module can be realized by a single multilayer body in the above manner to provide the compact high-frequency switch module.

Next, a high-frequency switch module according to a second preferred embodiment of the present invention will now be described with reference to FIG. 6.

Figure 6:
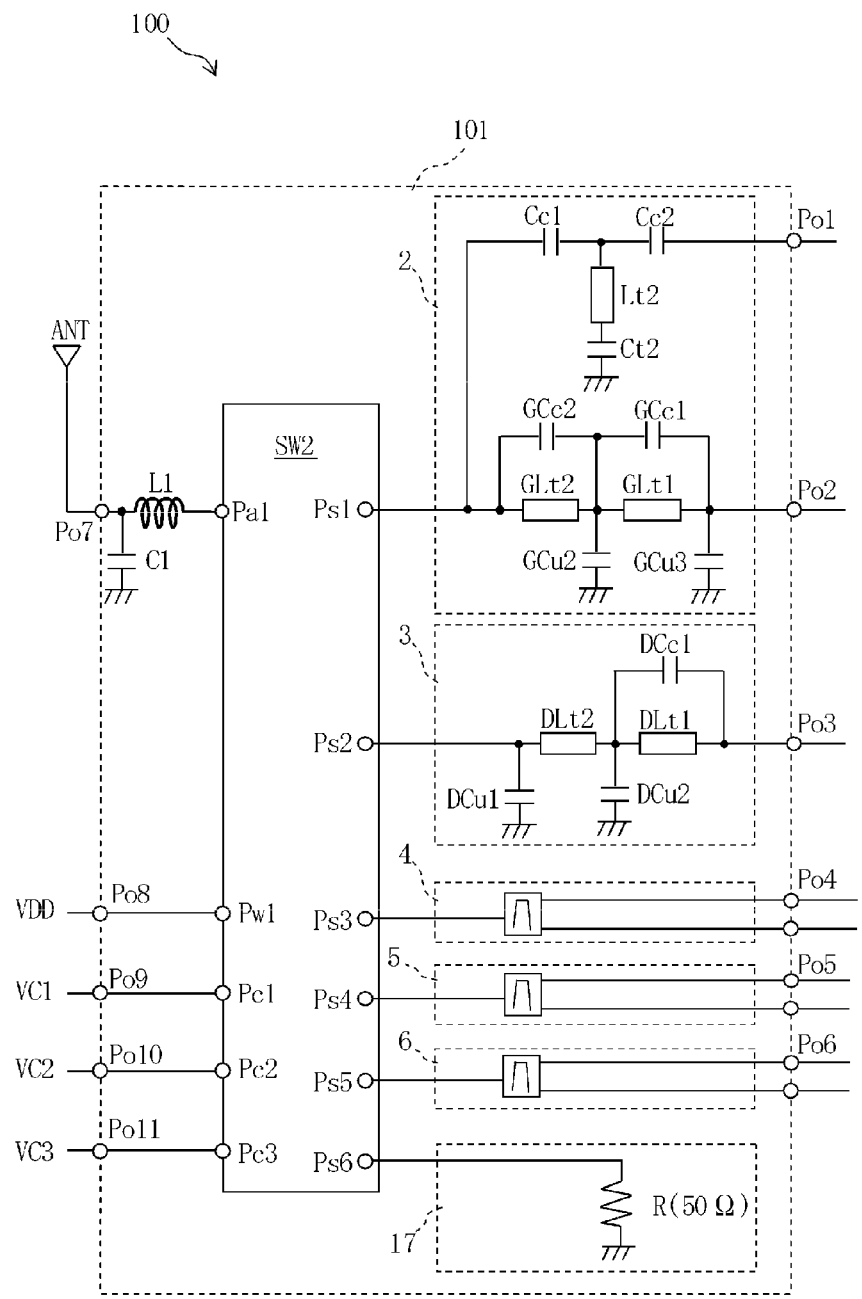
FIG. 6 is a block diagram schematically showing a front-end unit including a high-frequency switch module according to a second preferred embodiment of the present invention.

FIG. 6 is a block diagram schematically showing a front-end unit including the high-frequency switch module of the present preferred embodiment. The same reference numerals are used in FIG. 6 to identify components similar to the above components.

A high-frequency switch module 101 differs from the high-frequency switch module 1 in the configuration of a GND circuit 17. Specifically, the GND circuit 17 is preferably configured so as to include a termination resistor R having a characteristic impedance of about 50Ω, for example, between the switch port Ps6 and the GND electrode.

With such a configuration, even if the switch port Ps6 temporarily conducts to the antenna port Pa1 in switching of the connection with the semiconductor FET switch, the amount of signal supplying from the antenna port to the free switch port Ps6 can be consumed with the termination resistor R. Accordingly, the amount of reflection at the switch port Ps6 is reduced to suppress the amount of signal leaking from the antenna port Pa1 into the switch ports Ps1 to Ps5. Consequently, it is possible to ensure the isolation between the antenna port and the switch ports even if the free switch port is provided as in the present preferred embodiment.

A result of measurement of isolation characteristics in simulation in which the termination condition at the free switch port Ps6 is varied will now be described. FIG. 7 illustrates the result of the simulation.

In the simulation, a termination condition in which no element is connected to the free switch port Ps6 to make the free switch port Ps6 open, a termination condition in which the GND circuit 7 is connected to the free switch port Ps6, and a termination condition in which the GND circuit 17 is connected to the free switch port Ps6 are compared with each other. The isolation characteristic between the antenna port Pa1 and the switch port Ps3, the isolation characteristic between the antenna port Pa1 and the switch port Ps4, and the isolation characteristic between the antenna port Pa1 and the switch port Ps5 under the respective termination conditions are measured.

As the result of the measurement, the isolation characteristics in every switch port are improved under the termination condition in which the GND circuit 7 is connected to the free switch port Ps6 and the termination condition in which the GND circuit 17 is connected to the free switch port Ps6, compared with the termination condition in which no element is connected to the free switch port Ps6 to make the free switch port Ps6 open.

When the GND circuit 7 is connected to the free switch port Ps6, a signal input through the antenna port is entirely reflected at the antenna port and is not incident on the semiconductor FET switch. In contrast, when the GND circuit 17 is connected to the free switch port Ps6, the signal may not be entirely consumed at the 50Ω resistor due to, for example, a variation in the resistance or the frequency characteristics of the resistor because the GND circuit 17 is grounded via the termination resistor of 50Ω, thus reducing the improvement effect of the isolation characteristics, compared with the case in which the GND circuit 7 is used.

Next, a high-frequency switch module according to a third preferred embodiment of the present invention will now be described with reference to FIG. 8.

Figure 8:
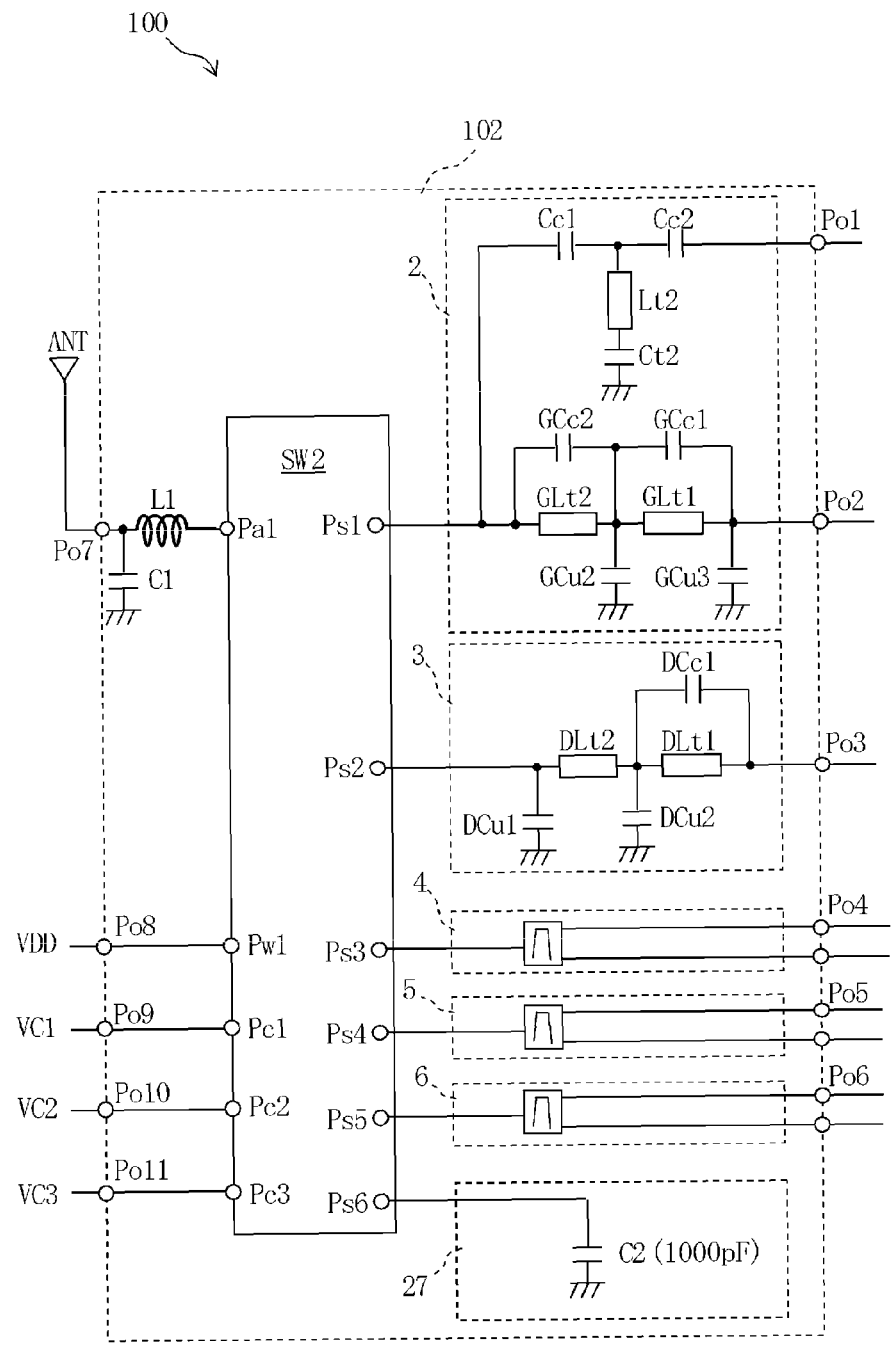
FIG. 8 is a block diagram schematically showing a front-end unit including a high-frequency switch module according to a third preferred embodiment of the present invention.

FIG. 8 is a block diagram schematically showing a front-end unit including the high-frequency switch module of the present preferred embodiment. The same reference numerals are used in FIG. 8 to identify components similar to the above components.

A high-frequency switch module 102 differs from the high-frequency switch module 1 in the configuration of a GND circuit 27 and a switch element SW2. Specifically, the semiconductor FET switch in the switch element SW2 preferably is a GaAs semiconductor FET switch, and the GND circuit 27 is preferably configured so as to include a capacitor C2 of 1,000 pF between the switch port Ps6 and the GND electrode.

The provision of the capacitor C2 decreases the impedance at the frequency of a signal that is input and making the GND circuit 27 close to the grounded state at the frequency allows the signal to be reflected at the antenna port. As a result, it is possible to improve the isolation characteristics between the antenna port and the switch ports.

Next, a high-frequency switch module according to a fourth preferred embodiment of the present invention will now be described with reference to FIG. 9.

Figure 9:
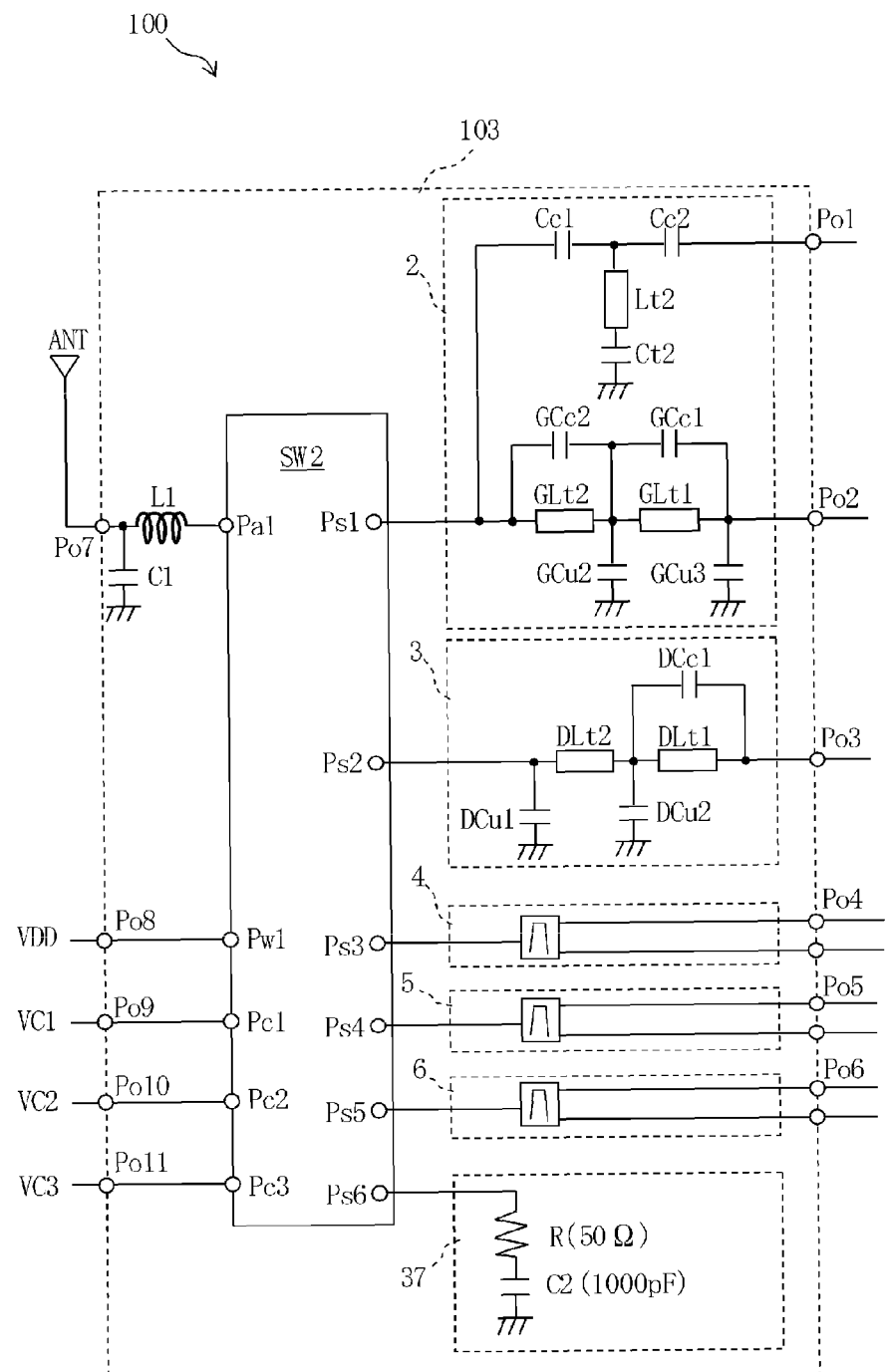
FIG. 9 is a block diagram schematically showing a front-end unit including a high-frequency switch module according to a fourth preferred embodiment of the present invention.

FIG. 9 is a block diagram schematically showing a front-end unit including the high-frequency switch module of the present preferred embodiment. The same reference numerals are used in FIG. 9 to identify components similar to the above components.

A high-frequency switch module 103 differs from the high-frequency switch module 102 in the configuration of a GND circuit 37. Specifically, the GND circuit 37 is preferably configured so as to include the termination resistor R having a characteristic impedance of about 50Ω and the capacitor C2 of about 1,000 pF between the switch port Ps6 and the GND electrode, for example.

The provision of the capacitor C2 decreases the impedance at the frequency of a signal that is input and making the GND circuit 27 close to the grounded state at the frequency allows the signal to be reflected at the antenna port. As a result, it is possible to improve the isolation characteristics between the antenna port and the switch ports. Furthermore, even if the switch port Ps6 temporarily conducts to the antenna port Pa1 in switching of the connection with the semiconductor FET switch, the amount of signal supplying from the antenna port to the free switch port Ps6 can be consumed with the termination resistor R to improve the isolation characteristics. As described above, in the present preferred embodiment, the isolation characteristics can be improved by using both of the capacitor C2 and the termination resistor R.

Next, a high-frequency switch module according to a fifth preferred embodiment of the present invention will now be described with reference to FIG. 10.

Figure 10:
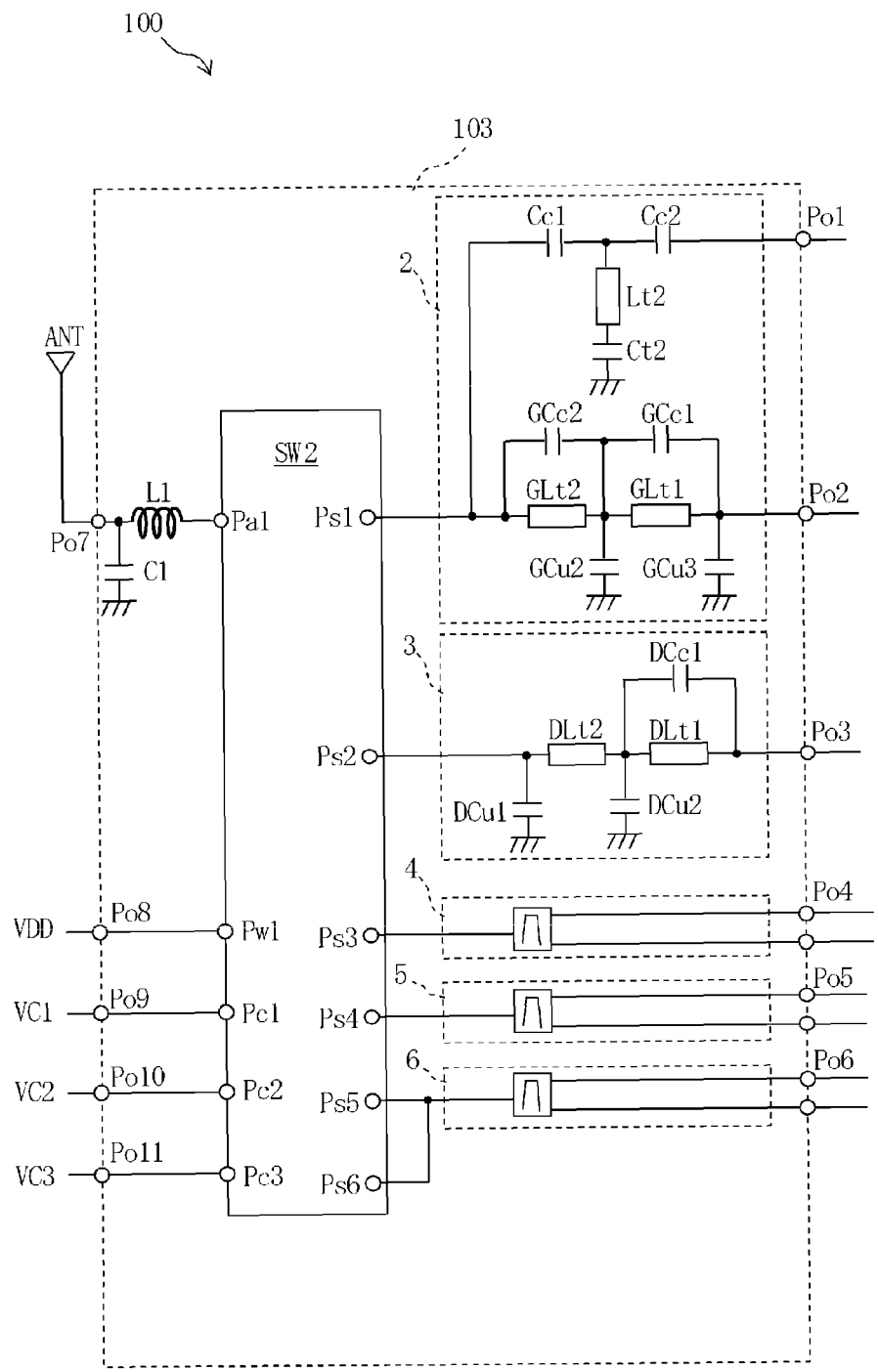
FIG. 10 is a block diagram schematically showing a front-end unit including a high-frequency switch module according to a fifth preferred embodiment of the present invention.

FIG. 10 is a block diagram schematically showing a front-end unit including the high-frequency switch module of the present preferred embodiment. The same reference numerals are used in FIG. 10 to identify components similar to the above components.

In a high-frequency switch module 104, the switch port Ps6, which is a free switch port, is conductively connected to another switch port Ps5. Since the free switch port Ps6 is not in the open state when the antenna port Pa1 is connected to the free switch port Ps6, it is possible to prevent leakage of the signal from the free switch port Ps6 into the other switch ports Ps1 to Ps4, thus improving the isolation characteristics.

Although the SP6T-type switch elements are preferably used in the above preferred embodiments, the present invention can be preferably embodied even by a high-frequency switch module including the switch ports of another type, for example, as long as one or more free switch ports are provided.

In addition, as described above, the free switch port can be connected to the GND electrode directly or via an impedance unit or the free switch port can be connected to another switch port to provide the high-frequency switch module capable of supporting communication systems of a number that is not larger than (n−1) by preferably using a semiconductor FET switch including n-number (n is an integer larger than or equal to two) switch ports.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high-frequency switch module comprising:
    a ceramic multilayer substrate including a plurality of dielectric layers and a plurality of wiring electrodes that are alternately arranged;
    a switch element including an antenna port connected to an antenna through which a communication signal is transmitted and received, a plurality of switch ports that is alternatively selected for connection to the antenna port, and a FET switch arranged to switch the connection between the switch ports and the antenna port;
    a high-frequency circuit arranged to connect any of the plurality of switch ports to a communication-signal processing circuit processing the communication signal; and
    a GND circuit including at least one free switch port among the plurality of switch ports, to which the high-frequency circuit is not connected, the at least one free switch port being connected to a GND electrode directly or via an impedance unit including a circuit element in the GND circuit; wherein
    in the FET switch, the at least one free switch port is temporarily connected to the antenna port during switching of the connection between the switch ports and the antenna port;
    the switch element, the high-frequency circuit, and the GND circuit are integrally disposed on or in the ceramic multilayer substrate;
    the GND electrode is disposed on a surface of one of the plurality of dielectric layers different from a surface on which the switch element is mounted; and
    the at least one free switch port is connected to the GND electrode through a via hole electrode in the GND circuit.

2. The high-frequency switch module according to claim 1, wherein the impedance unit includes a resistor having a characteristic impedance of about 50Ω.

3. The high-frequency switch module according to claim 1, wherein the FET switch is a GaAs semiconductor FET switch, and the impedance unit includes a capacitor connected in series between the connected switch port and the GND electrode.

4. The high-frequency switch module according to claim 1, wherein the ceramic multilayer substrate includes a plurality of GND electrodes, and the connected free switch port is directly connected to the GND electrode that is arranged closest to the installation surface of the switch element in a layering direction of the dielectric layers through the via hole electrode provided in the ceramic multilayer substrate in the GND circuit.

5. The high-frequency switch module according to claim 1, wherein the plurality of switch ports are arranged along a peripheral edge of one main surface of the switch element, and the free switch port is arranged so as to be sandwiched between the plurality of switch ports.

* * * * *